United States Patent
Reuter

(10) Patent No.: US 10,593,859 B2
(45) Date of Patent: Mar. 17, 2020

(54) PIEZOELECTRIC ADJUSTMENT APPARATUS

(71) Applicant: Marco Systemanalyse und Entwicklung GmbH, Dachau (DE)

(72) Inventor: Martin Reuter, Dachau (DE)

(73) Assignee: Marco Systemanalyse und Entwicklong GmbH (DE)

( * ) Notice: Subject to any disclaimer, the term of this patent is extended or adjusted under 35 U.S.C. 154(b) by 542 days.

(21) Appl. No.: 15/585,564

(22) Filed: May 3, 2017

(65) Prior Publication Data

US 2017/0331026 A1    Nov. 16, 2017

(30) Foreign Application Priority Data

May 12, 2016    (DE) .......... 10 2016 108 811

(51) Int. Cl.
| | | |
|---|---|---|
| *H01L 41/09* | (2006.01) | |
| *H01L 41/04* | (2006.01) | |
| *F16K 31/00* | (2006.01) | |
| *H01L 41/053* | (2006.01) | |
| *H02N 2/04* | (2006.01) | |
| *F16K 37/00* | (2006.01) | |
| *H01L 41/083* | (2006.01) | |

(52) U.S. Cl.
CPC .......... *H01L 41/042* (2013.01); *F16K 31/004* (2013.01); *F16K 31/007* (2013.01); *F16K 37/0041* (2013.01); *H01L 41/053* (2013.01); *H01L 41/083* (2013.01); *H01L 41/094* (2013.01); *H02N 2/043* (2013.01)

(58) Field of Classification Search
CPC ... H01L 41/053; H01L 41/083; H01L 41/094; H01L 41/042; F16K 31/004; F16K 31/007; H02N 2/043
USPC .... 310/323.01, 323.12, 323.17, 323.19, 328, 310/346
See application file for complete search history.

(56) References Cited

U.S. PATENT DOCUMENTS

| | | | | |
|---|---|---|---|---|
| 10,008,657 | B2* | 6/2018 | Reuter | ................. F16K 31/007 |
| 2001/0047828 | A1* | 12/2001 | Berger | ................ F15B 13/0438 |
| | | | | 137/596.17 |
| 2008/0264496 | A1* | 10/2008 | Reuter | ................. F16K 31/006 |
| | | | | 137/528 |
| 2010/0284026 | A1* | 11/2010 | Reuter | ................. B05B 1/3046 |
| | | | | 356/614 |

FOREIGN PATENT DOCUMENTS

| | | |
|---|---|---|
| DE | 4220177 A1 | 12/1993 |
| DE | 19653052 A1 | 6/1998 |
| DE | 19912334 A1 | 9/2000 |

(Continued)

OTHER PUBLICATIONS

Communication received from the Patent Office in Japan for related Japanese Application No. 2017-086762; 3 pages.

(Continued)

*Primary Examiner* — Thomas M Dougherty
(74) *Attorney, Agent, or Firm* — Dickinson Wright, PLLC

(57) ABSTRACT

A piezoelectric adjustment apparatus has a piezo element whose movement is transmitted via a lever to a plunger. The plunger can be set against an abutment that is arranged at one side of the lever and a second abutment is provided at the other side of the lever.

10 Claims, 2 Drawing Sheets

(56) References Cited

FOREIGN PATENT DOCUMENTS

Figure 1:
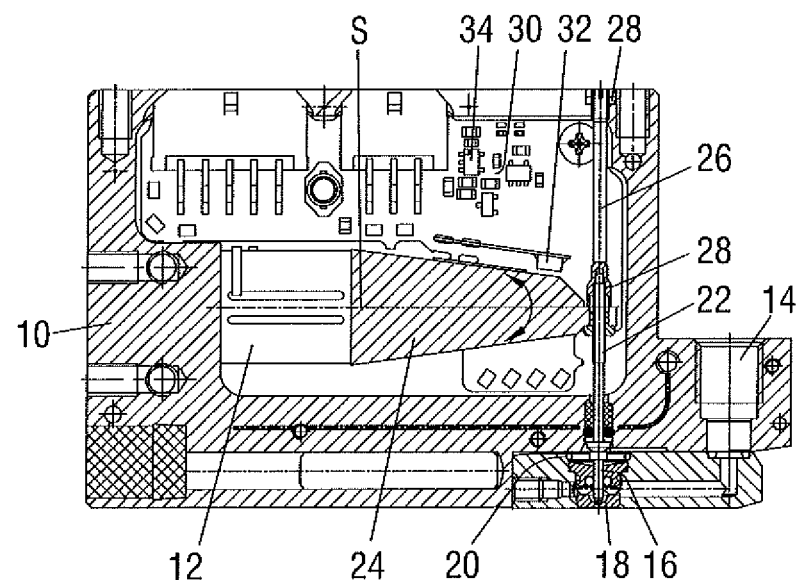

| | | |
|---|---|---|
| DE | 102014101512 A1 | 8/2015 |
| JP | H03234981 A | 10/1991 |
| JP | H06140682 A | 5/1994 |
| JP | 2002335662 A | 11/2002 |
| JP | 2003510509 A | 3/2003 |
| JP | 2006527346 A | 11/2006 |
| JP | 2009299799 A | 12/2009 |
| JP | 2015121898 A | 7/2015 |
| WO | 2015074674 A1 | 3/2015 |

OTHER PUBLICATIONS

Official Communication from the German Patent Office for German Application No. 102016108811.0; dated Jan. 25, 2017; 8 pages.

\* cited by examiner

PIEZOELECTRIC ADJUSTMENT APPARATUS

The present invention relates to a piezoelectric adjustment apparatus having a piezo element whose movement is transmitted via a lever to a plunger that can be set against an abutment that is arranged at one side of the lever. Such an adjustment apparatus is known, for example, from DE 10 2014 101 512 A1. This known adjustment apparatus is suitable as a very reliable and fast drive for valves that has no temperature drift in the short term. The piezo element used has a symmetrical and antiparallel arrangement of two piezo-active zones that generate a tilt movement that is transmitted to the plunger via the common lever on an oppositely directed application of voltage. The plunger can serve as a valve plunger and is set against an abutment (valve seat) in operation that is arranged at one side of the lever.

It is the object of the present invention to further develop a piezoelectric adjustment apparatus in accordance with the preamble of claim 1 such that it also has a reduced drift of the piezo element in longer operation.

This object is satisfied by the features of claim 1 and in particular in that a second abutment for the lever is provided at the other side of the lever. The piezoelectric adjustment apparatus is operated symmetrically by such a second abutment, which surprisingly results in a considerably improved long-term behavior. It has namely been found that in an asymmetrical operation of the adjustment apparatus the two piezo zones of the piezo element change their behavior differently. A drift of the working range in particular occurs at high temperatures and on the increase of the power toward one side caused by the abutment (valve seat) and requires a readjustment after a number of cycles. The stroke of the piezo element is therefore not constant over the operating time, whereby the throughflow of the valve operated by the adjustment apparatus also changes.

It is, however, achieved by the solution in accordance with the invention that the lever is moved toward an abutment at both sides, with the first abutment being formed by a valve seat of the valve. The working range of the piezo element can then be controlled such that the load is as symmetrical as possible such that the free end of the lever is moved toward an abutment in the same manner at both sides.

Advantageous embodiments of the invention are disclosed in the description, in the drawing and in the dependent claims.

In accordance with a first advantageous embodiment, the second abutment can have an anvil to minimize the wear.

In accordance with a further advantageous embodiment, the second abutment can be adjustable and fixable so that the maximum stroke of the free end of the lever can be set and fixed.

In accordance with a further advantageous embodiment, the stroke of the lever from a neutral position up to the reaching of the first abutment and up to the reaching of the second abutment can be of the same size. Symmetrical relationships are hereby provided that positively influence the long-term drift of the piezo element.

In accordance with a further advantageous embodiment, a distance measuring device, in particular a temperature compensated distance measuring device, can be provided that detects the stroke of the lever. The stroke of the piezo element that varies with the temperature, the age and the number of cycles can hereby be corrected. If furthermore a voltage measuring device is provided by which the voltage applied to the piezo element is measured, the abutting of the respective abutment can be recognized by a comparison of the voltage change and distance change since the distance measurement also no longer changes on a further increasing or dropping voltage. A coverage, i.e. the degree by which pressing into the respective abutment takes place, can be derived from this and can be varied by adaptation or regulation of the voltage. The drift of the piezo element can also hereby be determined and can be automatically compensated by a correct adaptation of the voltage. The control can furthermore be configured such that it determines a drift of the piezo element and compensates it automatically by a corresponding adaptation of the voltage. In the case of a no longer sufficient stroke due to aging of the piezo element, this can be recognized by the control and a required exchange of the drive can be displayed.

In accordance with a further advantageous embodiment, a temperature sensor can be provided in the adjustment apparatus to compensate a temperature dependency of the distance measurement or to correct it by the control.

In accordance with a further advantageous embodiment, a force measuring device can be provided by which the force is determined by which the lever is pressed toward the two abutments. Since the electrical capacitance of the piezo element depends on its load, a force measurement is possible with the aid of a current sensor or of a current measurement. The force can hereby be determined by which pressing toward the respective abutment takes place. It is possible to move toward the first abutment with a defined force by a corresponding selection of the voltage stroke and of the offset of the voltage, with it being possible to move into the second abutment with a force that is not necessarily identical when the tilt movement of the lever reverses. The force measurement can also deliver redundant information on the voltage correlation.

Figure 2:
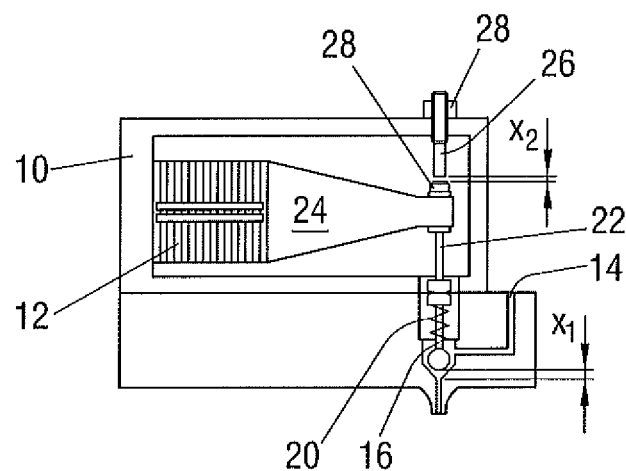

The present invention will be described in the following purely by way of example with reference to an advantageous embodiment and to the enclosed drawings. There are shown:

FIG. 1 a cross-sectional view through a piezoelectric adjustment apparatus;

FIG. 2 a simplified representation of the apparatus of FIG. 1; and

Figure 3:
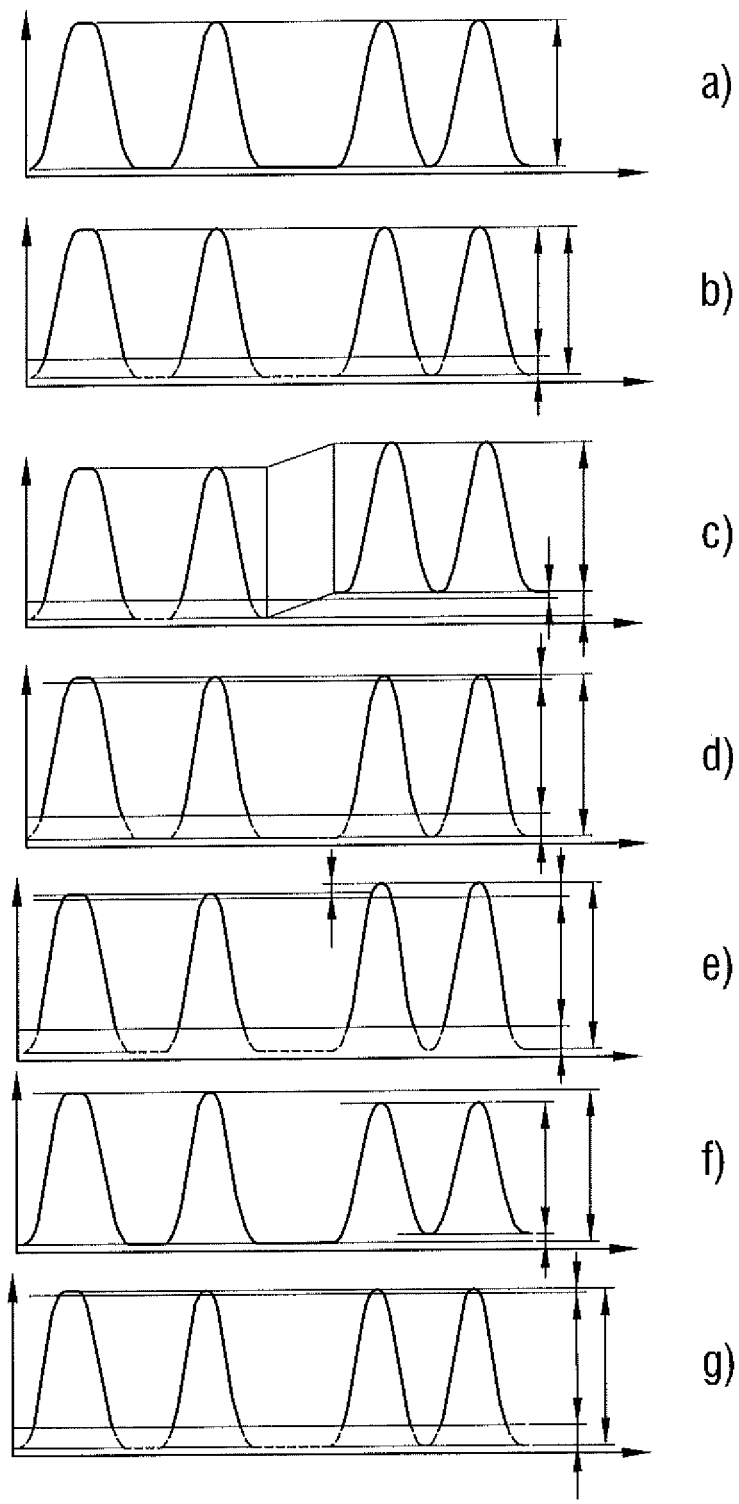

FIG. 3 different stroke curves.

The piezoelectric adjustment apparatus shown in FIG. 1 is generally of a similar design to that described in DE 10 2014 101 512 A1 whose total disclosure is made part of the content of this application by reference. The adjustment apparatus has a piezo element 12 that is arranged in a housing 10 and that is composed in a generally known manner of a plurality of layers of piezoelectric material arranged in a stacked manner and respectively provided with electrodes. The piezo element 12 is furthermore configured for a tilting drive movement as is indicated by a double arrow in FIG. 1. In more precise terms, the piezo element 12 works in accordance with the so-called double-stack principle and comprises, in addition to two piezoelectrically active regions, a piezoelectrically passive region, as is disclosed in EP 0 947 002 B1.

In the embodiment shown, the piezoelectric adjustment apparatus is part of a metering valve to be able to dispense fluid supplied through an inlet 14 in a dosed manner. For this purpose, the metering valve has a valve needle 16 that closes an outlet opening provided in a valve seat 18.

To move the valve needle 16 against the force of an opening spring 20, a plunger 22 is provided whose lower end contacts the valve needle 16 and whose upper end is connected to the free front end of a lever 24 that can be set into tilt oscillations by the piezo element 12. The lever 24 tilts as indicated by the double arrow in FIG. 1 by a corresponding control of the piezo element 12, whereby the plunger 22 and thus also the valve needle 16 carry out a linear stroke movement. The valve needle 16 is held in its open position by the spring 20 and is moved into the closed position by the plunger 22 against the pressure of the spring. As can be recognized from FIG. 1 and FIG. 2 in this respect, the valve seat 18 that is arranged, with respect to the axis of symmetry S of the lever, at one side of said lever acts as an abutment for the plunger 22 and thus also for the movement of the lever 24.

To achieve the piezo element 12 being uniformly loaded, it is provided in accordance with the invention that the stroke movement of the lever (and thus also the tilt movement of the piezo element 12) is not only bounded by an abutment (valve seat 18) at one side, but also that a second abutment is also provided for the lever at the other side of the lever 24 (relative to is axis of symmetry S) such that the free end of the lever 24 abuts an abutment on the pivot movement of said lever. In the embodiment shown, the second abutment is formed by a pin 26 that is screwed into the valve housing 10 and can be secured with the aid of a fixing device 28. The position of the second abutment 26 in the housing 10 is adjustable and also fixable in this manner such that the point of incidence on the second abutment 26 can be set by adjustment.

To reduce the wear, the lever 24 is provided at its outer free end with an anvil 28 in whose lower side the plunger 22 is screwed and whose upper side serves as an impact surface on the impact onto the second abutment 26.

FIG. 2 illustrates the stroke relationships in the above-described adjustment apparatus. In the neutral position shown in FIG. 2, i.e. in the voltage-free state of the piezo element 12, the piezo element 12 and thus also the lever 24 has a free stroke $x_1$ and $x_2$ of equal size toward both sides. The stroke $x_1$ is in this respect the spacing between the valve seat 18 and the lower end of the valve needle 16 and the stroke $x_2$ is the spacing between the respective impact surfaces of the anvil 28 and of the pin 26. The total stroke is in this respect settable via the spacing between the seal seat 18 and the second abutment 26.

For an improved control of the piezo element 12, the adjustment apparatus has a control 30 that is connected to a distance sensor 32 that detects the distance of the free end of the lever 24 and thus the stroke of the drive. The control 30 furthermore measures the control voltage and the supplied current of the piezo element, whereby a force measurement is possible. The force can hereby be determined with which pressing takes place into the seal seat and toward the second abutment 26. The seal seat position can also be determined by the control 30.

Finally, the control 30 also comprises a temperature sensor 34 to compensate a temperature dependency of the distance measurement or to correct it by the control.

FIG. 3 shows different stroke curves that were determined by the distance sensor 30 and that illustrate the manner in which the control of the adjustment apparatus in accordance with the invention can improve a precise and long-term stable metering.

FIG. 3a) shows the voltage stroke on the application of an alternating voltage to the piezo element 12 and FIG. 3b) shows the corresponding stroke that the valve needle carries out. As can be recognized, the valve needle 16 is pressed toward the valve seat with a specific force for a specific time on impacting the valve seat 18.

FIG. 3c) illustrates the stroke of the valve needle 16 after a longer operating time due to an asymmetrical manner of working of the adjustment element, i.e. without the provided second abutment 26.

By the provision of the second abutment 26 (FIG. 3d)), a symmetrical mode of operation of the adjustment apparatus is achieved that considerably reduces a drift of the stroke.

FIG. 3e) illustrates an occurring stroke change due to the temperature and aging of the piezo element 12. With the aid of the control, however, a compensation can be achieved by a changed voltage stroke (cf. FIG. 3f)) and the stroke can again be corrected to a symmetrical deflection by a correction of the control (cf. FIG. 3g)).

The invention claimed is:

1. A piezo electric adjustment apparatus having a piezo element whose movement is transmitted via a lever to a plunger, with the plunger being able to be set against a first abutment, said first abutment being arranged at one side of the lever, the piezo electric adjustment apparatus further comprising a second abutment for the lever, with the second abutment being provided at the other side of the lever.

2. The adjustment apparatus in accordance with claim 1, wherein the lever has an anvil.

3. The adjustment apparatus in accordance with claim 1, wherein the second abutment is adjustable and fixable.

4. The adjustment apparatus in accordance with claim 1, wherein the stroke from a neutral position of the lever up to the reaching of the first abutment and up to the reaching of the second abutment is of equal size.

5. The adjustment apparatus in accordance with claim 1, wherein a distance measuring device is provided that detects the stroke of the lever.

6. The adjustment apparatus in accordance with claim 5, wherein the distance measuring device is a temperature-compensated distance measuring device.

7. The adjustment apparatus in accordance with claim 1, wherein a force measuring device is provided by which the force is determined by which the lever is pressed toward the first and second abutments.

8. The adjustment apparatus in accordance with claim 1, wherein a voltage measuring device is provided by which the voltage applied to the piezo element is measured.

9. The adjustment apparatus in accordance with claim 5, wherein a voltage measuring device is provided by which the voltage applied to the piezo element is measured and wherein a control is provided by which the position of the first and/or second abutments is determined from the correlation of the voltage measurement and distance measurement.

10. The adjustment apparatus in accordance with claim 1, wherein a control is provided that determines a force by which the lever abuts against the first and second abutments.

* * * * *